(12) United States Patent
Xu et al.

(10) Patent No.: US 10,361,125 B2
(45) Date of Patent: Jul. 23, 2019

(54) METHODS AND STRUCTURES FOR FORMING UNIFORM FINS WHEN USING HARDMASK PATTERNS

(71) Applicant: International Business Machines Corporation, Armonk, NY (US)

(72) Inventors: Peng Xu, Santa Clara, CA (US); Kangguo Cheng, Schenectady, NY (US); Yann Mignot, Slingerlands, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/846,844

(22) Filed: Dec. 19, 2017

(65) Prior Publication Data

US 2019/0189519 A1  Jun. 20, 2019

(51) Int. Cl.

| | |
|---|---|
| *H01L 29/06* | (2006.01) |
| *H01L 29/66* | (2006.01) |
| *H01L 21/308* | (2006.01) |
| *H01L 21/311* | (2006.01) |
| *H01L 21/762* | (2006.01) |
| *H01L 27/088* | (2006.01) |
| *H01L 21/3065* | (2006.01) |

(Continued)

(52) U.S. Cl.
CPC .... *H01L 21/823431* (2013.01); *H01L 21/308* (2013.01); *H01L 21/3065* (2013.01); *H01L 21/3081* (2013.01); *H01L 21/3086* (2013.01); *H01L 21/3088* (2013.01); *H01L 21/32139* (2013.01); *H01L 21/76224* (2013.01); *H01L 21/823481* (2013.01); *H01L 27/0886* (2013.01); *H01L 29/0649* (2013.01); *H01L 29/6653* (2013.01); *H01L 29/6656* (2013.01); *H01L 21/31111* (2013.01); *H01L 21/31116* (2013.01)

(58) Field of Classification Search
CPC ............ H01L 21/3088; H01L 21/3081; H01L 21/3086; H01L 21/308; H01L 21/32139
See application file for complete search history.

(56) References Cited

U.S. PATENT DOCUMENTS

| | | | |
|---|---|---|---|
| 6,867,460 | B1 | 3/2005 | Anderson et al. |
| 7,112,858 | B2 | 9/2006 | Inaba et al. |

(Continued)

OTHER PUBLICATIONS

US 8,508,000 B1, 08/2013, Chang et al. (withdrawn)

*Primary Examiner* — Ngan V Ngo
(74) *Attorney, Agent, or Firm* — Vazken Alexanian; Ryan, Mason & Lewis, LLP

(57) ABSTRACT

A method for manufacturing a semiconductor device includes forming a hardmask layer on a substrate, patterning the hardmask layer to form a plurality of patterned hardmask portions on the substrate, depositing a dummy hardmask layer on the substrate, patterning the dummy hardmask layer to form a plurality of patterned dummy hardmask portions on the substrate, wherein each of the plurality of patterned dummy hardmask portions is positioned adjacent respective outermost patterned hardmask portions of the plurality of patterned hardmask portions, and transferring a pattern of the plurality of patterned hardmask portions and the plurality of patterned dummy hardmask portions to the substrate to form a plurality of fins and a plurality of dummy fins from the substrate.

13 Claims, 6 Drawing Sheets

(51) Int. Cl.
*H01L 21/3213* (2006.01)
*H01L 21/8234* (2006.01)

(56) References Cited

U.S. PATENT DOCUMENTS

| | | | |
|---|---|---|---|
| 7,141,856 B2 | 11/2006 | Lee et al. | |
| 8,466,012 B1 | 6/2013 | Chang et al. | |
| 8,658,536 B1 | 2/2014 | Choi et al. | |
| 9,337,050 B1 | 5/2016 | Xie et al. | |
| 9,397,099 B1* | 7/2016 | Huang | H01L 29/785 |
| 9,570,443 B1* | 2/2017 | Balakrishnan | H01L 27/0924 |
| 9,768,072 B1* | 9/2017 | Cheng | H01L 21/823487 |
| 9,853,131 B1* | 12/2017 | Cheng | H01L 21/823418 |
| 2006/0175667 A1* | 8/2006 | Tsuchiaki | H01L 21/823821 257/391 |
| 2013/0093026 A1 | 4/2013 | Wann et al. | |
| 2013/0277760 A1* | 10/2013 | Lu | H01L 29/10 257/401 |
| 2015/0147874 A1* | 5/2015 | Huang | H01L 21/823431 438/514 |
| 2015/0206759 A1* | 7/2015 | Tsao | H01L 29/0653 257/506 |
| 2015/0279971 A1 | 10/2015 | Xie et al. | |
| 2015/0294976 A1* | 10/2015 | Kim | H01L 27/1104 438/702 |
| 2016/0218010 A1* | 7/2016 | Lee | H01L 21/28132 |
| 2016/0233246 A1 | 8/2016 | Anderson et al. | |
| 2016/0308027 A1* | 10/2016 | Chang | H01L 21/3086 |
| 2017/0005169 A1* | 1/2017 | Loubet | H01L 29/1054 |
| 2017/0069504 A1* | 3/2017 | Li | H01L 21/3081 |
| 2017/0069539 A1* | 3/2017 | Li | H01L 21/823431 |
| 2017/0140992 A1* | 5/2017 | Chang | H01L 21/823418 |
| 2017/0170174 A1* | 6/2017 | Chang | H01L 27/0886 |
| 2017/0194149 A1* | 7/2017 | Chang | H01L 21/2253 |
| 2017/0263647 A1* | 9/2017 | Liu | H01L 21/7624 |
| 2018/0004882 A1* | 1/2018 | Hsieh | H01L 29/6681 |
| 2018/0097001 A1* | 4/2018 | Bi | H01L 27/0886 |
| 2018/0145131 A1* | 5/2018 | Wang | H01L 21/0217 |
| 2018/0182768 A1* | 6/2018 | Mihara | H01L 27/1157 |
| 2018/0247935 A1* | 8/2018 | Hsu | H01L 27/0886 |
| 2018/0254219 A1* | 9/2018 | Sun | H01L 21/823807 |

* cited by examiner

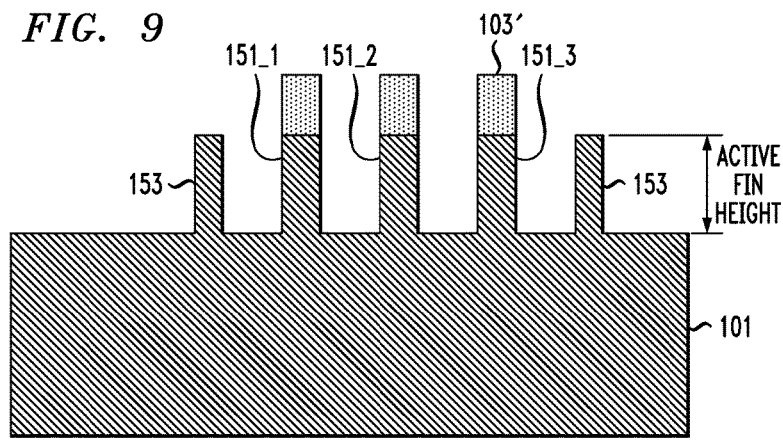
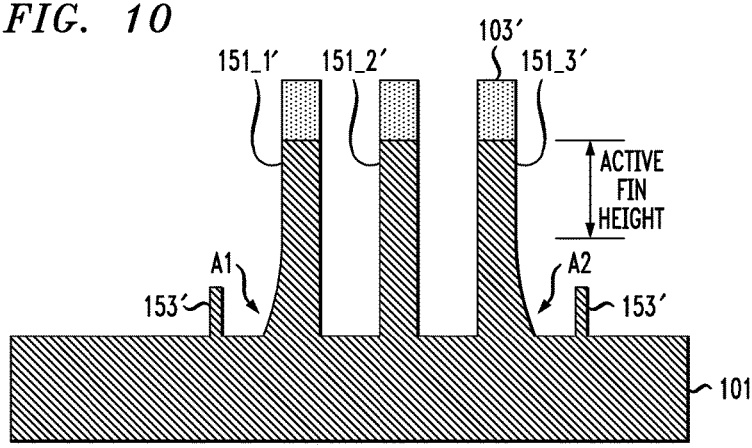
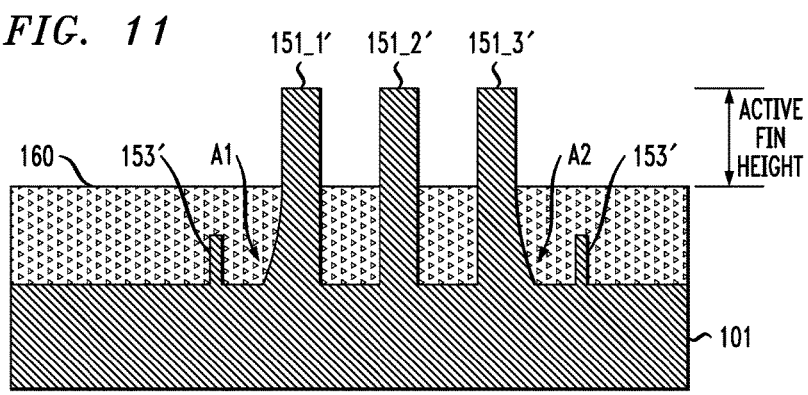

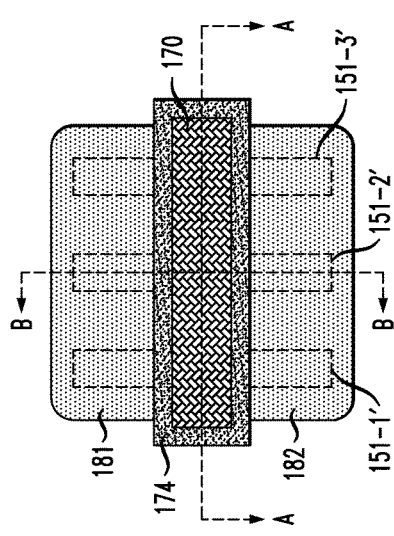
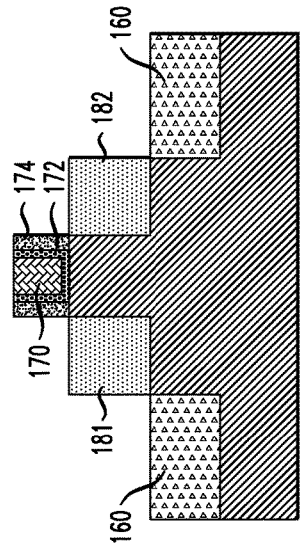
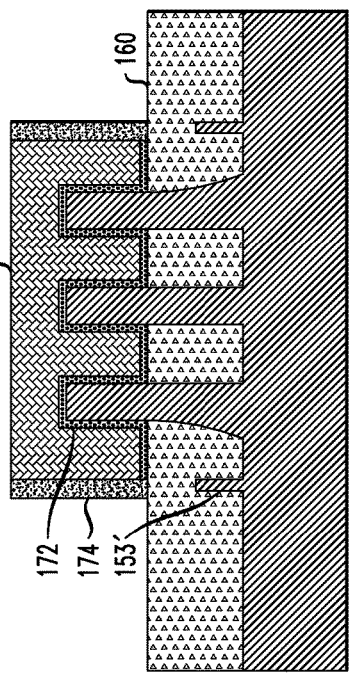
FIG. 12C
FIG. 12B
B-B XSECTION
FIG. 12A
A-A XSECTION

METHODS AND STRUCTURES FOR FORMING UNIFORM FINS WHEN USING HARDMASK PATTERNS

TECHNICAL FIELD

The field generally relates to semiconductor devices and methods of manufacturing same and, in particular, to using dummy fins to form uniform fins when using hardmask patterns.

BACKGROUND

Fin field-effect transistor (FinFET) devices include a transistor architecture that uses raised source-to-drain channel regions, referred to as fins. A FinFET device can be built on a semiconductor substrate, where a semiconductor material, such as silicon, is patterned into a fin-like shape and functions as the channel of the transistor.

Semiconductor devices, such as, for example, complementary metal-oxide semiconductor (CMOS) FinFET devices are continuously being scaled down to smaller dimensions. As components are scaled down and devices are being formed closer together, improved processing for forming fin structures is needed. For example, when using a hardmask pattern to form fins in a substrate, due to microloading etching effects, fins on the ends of a pattern of fins formed in a substrate will have a different critical dimension (e.g., lateral width) from inner fins of the pattern. The difference in critical dimension is due to the end fins having different environments than the inner fins, such as isolation regions, on their outer sides.

In some cases, the end fins will be wider than the middle fins, and in other cases the end fins may be narrower than the middle fins. In either case, there exists an undesirable non-uniformity between the critical dimensions of the end fins with respect to the inner (or middle) fins when forming fins with hardmask patterns.

SUMMARY

According to an exemplary embodiment of the present invention, a method for manufacturing a semiconductor device includes forming a hardmask layer on a substrate, patterning the hardmask layer to form a plurality of patterned hardmask portions on the substrate, depositing a dummy hardmask layer on the substrate, patterning the dummy hardmask layer to form a plurality of patterned dummy hardmask portions on the substrate, wherein each of the plurality of patterned dummy hardmask portions is positioned adjacent respective outermost patterned hardmask portions of the plurality of patterned hardmask portions, and transferring a pattern of the plurality of patterned hardmask portions and the plurality of patterned dummy hardmask portions to the substrate to form a plurality of fins and a plurality of dummy fins from the substrate.

According to an exemplary embodiment of the present invention, a semiconductor device includes a plurality of fins on a substrate, wherein each of the plurality of fins has the same or substantially the same critical dimension in an active fin region, a dielectric layer formed on the substrate and on and around each of the plurality of fins in a region below the active fin region, and a plurality of dummy fins formed on the substrate, wherein each of the plurality of dummy fins is positioned adjacent respective outermost fins of the plurality of fins, and is covered by the dielectric layer in the region below the active fin region, and wherein the respective outermost fins each comprise a different critical dimension from an adjacent inner fin in the region below the active fin region.

According to an exemplary embodiment of the present invention, a method for manufacturing a semiconductor device includes forming a plurality of patterned hardmask portions on a substrate, wherein each of the patterned hardmask portions are spaced apart from each other along the substrate in a horizontal direction with respect to a top surface of the substrate, forming a plurality of patterned dummy hardmask portions on the substrate, wherein each of the plurality of patterned dummy hardmask portions is positioned adjacent respective outermost patterned hardmask portions of the plurality of patterned hardmask portions, and etching portions of the substrate to form a plurality of fins and a plurality of dummy fins from the substrate, wherein the plurality of patterned hardmask portions and the plurality of patterned dummy hardmask portions are used as masks during the etching.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 9 is a cross-sectional view illustrating removal of the dummy hardmask portions in a method of manufacturing a semiconductor device, according to an exemplary embodiment of the present invention.

FIG. 10 is a cross-sectional view illustrating further removal of exposed portions of the substrate not covered by the remaining portions of the hardmask pattern in a method of manufacturing a semiconductor device, according to an exemplary embodiment of the present invention.

FIG. 11 is a cross-sectional view illustrating isolation layer deposition to form isolation regions and hardmask removal in a method of manufacturing a semiconductor device, according to an exemplary embodiment of the present invention.

FIGS. 12A and 12B are cross-sectional views and FIG. 12 C is a top view illustrating formation of a gate structure, spacers and source/drain regions in a method of manufacturing a semiconductor device, according to an exemplary embodiment of the present invention.

DETAILED DESCRIPTION

Figure 1:
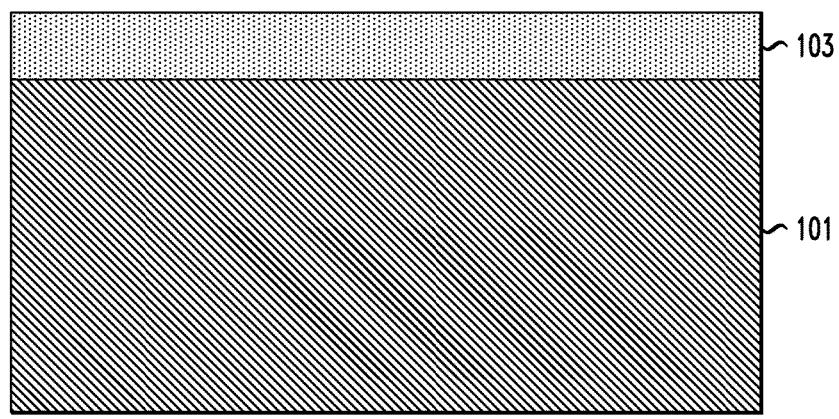
FIG. 1 is a cross-sectional view illustrating a hardmask layer formed on a substrate in a method of manufacturing a semiconductor device, according to an exemplary embodiment of the present invention.

Exemplary embodiments of the invention will now be discussed in further detail with regard to semiconductor devices and methods of manufacturing same and, in particular, to forming uniform fins on a substrate by using dummy fins to create uniform environments when patterning the substrate with hardmask patterns.

It is to be understood that the various layers and/or regions shown in the accompanying drawings are not drawn to scale, and that one or more layers and/or regions of a type commonly used in, for example, a complementary metal-oxide semiconductor (CMOS), field-effect transistor (FET), nanowire FET, fin field-effect transistor (FinFET), metal-oxide-semiconductor field-effect transistor (MOSFET), vertical FET, single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, FinFETs, nanowire FETs, nanosheet FETs, vertical FETs, SETs, CMOSs and/or MOSFETs. By way of non-limiting example, the semiconductor devices can include, but are not necessarily limited to FET, FinFET, nanowire FET, nanosheet FET, vertical FET, SET, CMOS and MOSFET devices, and/or semiconductor devices that use FET, FinFET, nanowire FET, nanosheet FET, vertical FET, SET CMOS and/or, MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the three-dimensional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the three-dimensional and/or cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

FIG. 1 is a cross-sectional view illustrating a hardmask layer formed on a substrate in a method of manufacturing a semiconductor device, according to an exemplary embodiment of the present invention. Referring to FIG. 1, a hardmask layer 103 including, for example, a dielectric material, such as silicon nitride (SiN), is formed on a substrate 101. The hardmask layer 103 can be deposited using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. In some embodiments, a planarization process, such as, chemical mechanical planarization (CMP) can be used to remove excess dielectric material. A height of the hardmask layer 103 can be in the range of, but is not necessarily limited to, 20 nm to 100 nm.

The substrate 101 is includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. In some embodiments, the substrate 101 includes both semiconductor materials and dielectric materials, for example, a layer of dielectric material on top of a layer of semiconductor material. In some embodiments, the substrate 101 includes other device structures (not shown) such as transistors, isolation structures (such as shallow trench isolations), contacts, conducting wires, etc.

Figure 2:
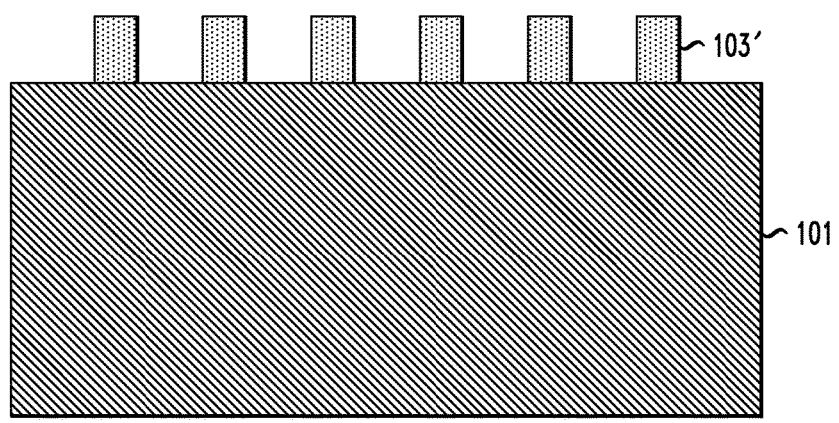
FIG. 2 is a cross-sectional view illustrating a hardmask pattern on a substrate in a method of manufacturing a semiconductor device, according to an exemplary embodiment of the present invention.

FIG. 2 is a cross-sectional view illustrating a hardmask pattern on a substrate in a method of manufacturing a semiconductor device, according to an exemplary embodiment of the present invention. Referring to FIG. 2, the hardmask layer 103 is patterned into a plurality of patterned hardmask portions 103'. The patterning can be performed using, for example, self-aligned multiple-patterning (SAMP) techniques, including, but not necessarily limited to, self-aligned double patterning (SADP), self-aligned quadruple patterning (SAQP) and self-aligned octuple patterning (SAOP).

Figure 3:
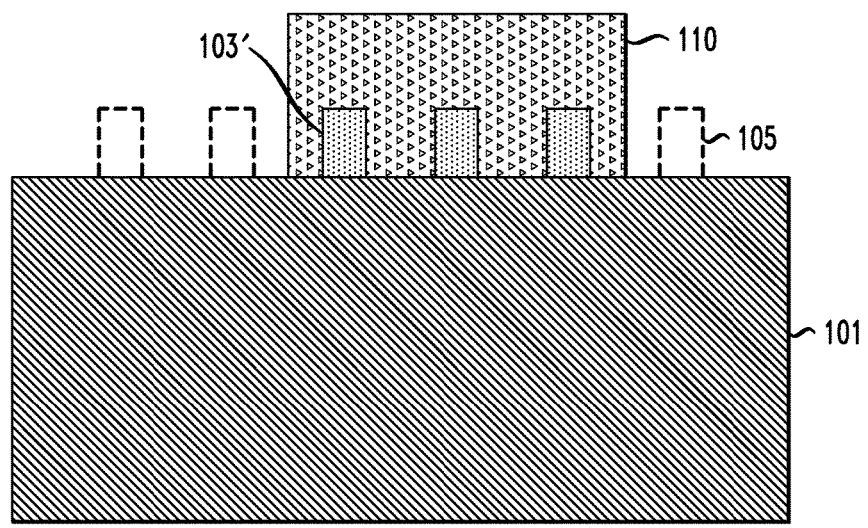
FIG. 3 is a cross-sectional view illustrating mask formation on a portion of the hardmask pattern and removal of exposed patterned hardmask portions from the hardmask pattern in a method of manufacturing a semiconductor device, according to an exemplary embodiment of the present invention.

FIG. 3 is a cross-sectional view illustrating mask formation on a portion of the hardmask pattern and removal of exposed patterned hardmask portions from the hardmask pattern in a method of manufacturing a semiconductor device, according to an exemplary embodiment of the present invention. Referring to FIG. 3, a mask 110, such as, for example, a photoresist including an optical planarization layer (OPL), is formed on the substrate 101 and on and around some of the patterned hardmask portions 103'. The mask 110 leaves exposed other ones of the patterned hardmask portions 103' that are to be removed. Depending on design constraints, and the desired resulting structure of fins, more or less patterned hardmask portions 103' can be left exposed to be removed. As shown by the phantom lines 105, the exposed patterned hardmask portions 103' are removed using, for example, an etching process such as, for example, wet etch (phosphoric acid for SiN), or dry etch such as reactive ion etch (RIE).

Figure 4:
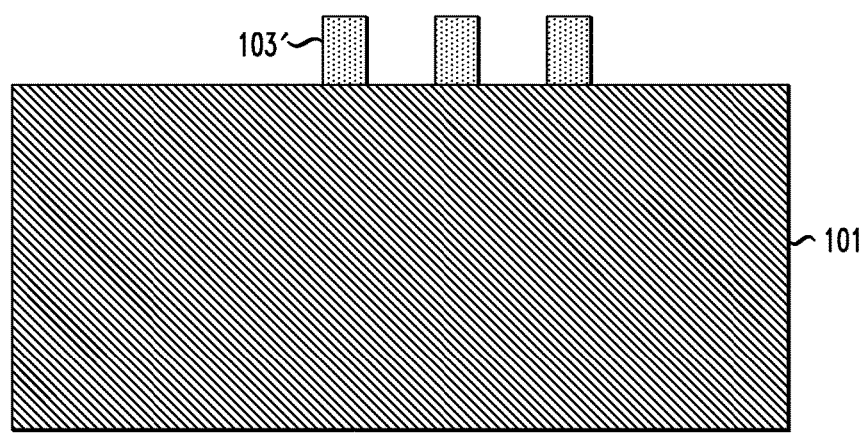
FIG. 4 is a cross-sectional view illustrating mask removal from the hardmask pattern in a method of manufacturing a semiconductor device, according to an exemplary embodiment of the present invention.

FIG. 4 is a cross-sectional view illustrating mask removal from the hardmask pattern in a method of manufacturing a semiconductor device, according to an exemplary embodiment of the present invention. Referring to FIG. 4, the mask 110 is removed from the remaining patterned hardmask portions 103' of the hardmask pattern using, for example, an oxygen plasma etch. Non-limiting ranges in connection with the hardmask portions include, for vertical height, 50 nm to 100 nm, for lateral width, 8 nm to 20 nm, and for pitch (lateral distance between centers of adjacent hardmask portions), 30 nm to 80 nm.

Figure 5:
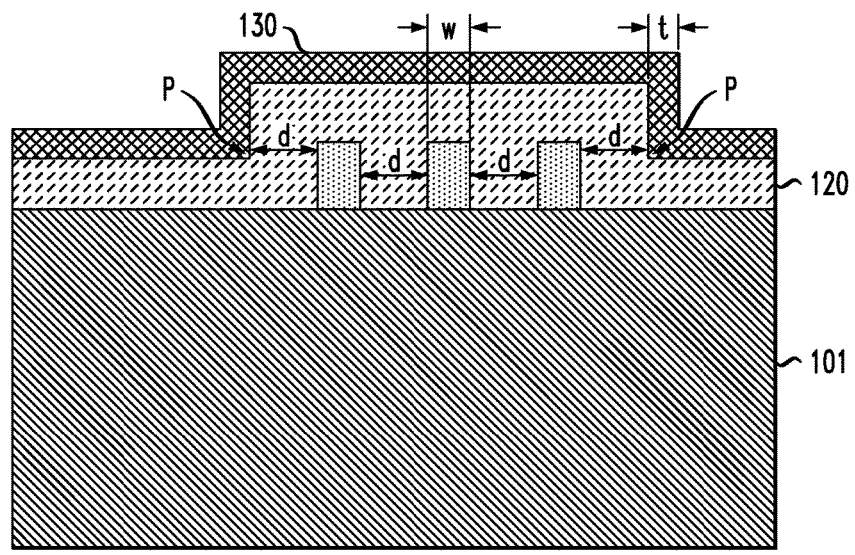
FIG. 5 is a cross-sectional view illustrating deposition of a dummy hardmask layer and a spacer layer in a method of manufacturing a semiconductor device, according to an exemplary embodiment of the present invention.

FIG. 5 is a cross-sectional view illustrating deposition of a dummy hardmask layer and a spacer layer in a method of manufacturing a semiconductor device, according to an exemplary embodiment of the present invention. Referring to FIG. 5, a dummy hardmask layer 120 including for example, an oxide, such as, but not necessarily limited to, silicon oxide (e.g., $SiO_2$ or $SiO_x$), SiOC, SiOCH, SiBCN, SiOCN is conformally deposited on all exposed surfaces, including on sidewalls and top surfaces of the patterned hardmask portions 103', and on the substrate 101. The dummy hardmask layer 120 can be deposited using conformal deposition techniques, including, but not limited to, atomic layer deposition (ALD), chemical vapor deposition (CVD), or molecular layer deposition (MLD).

As can be seen, due to the conformal deposition and pinch off, a portion of the dummy hardmask layer 120 over the and around the patterned hardmask portions 103' has a greater height above the substrate 101 than outer portions laterally farther away from the patterned hardmask portions 103'. Due to the conformal deposition and pinch off, points (P) are formed at a distance d from outer hardmask portions 103' on opposite sides, where the outer portions of the dummy hardmask layer 120 having the lower height meet the inner portion of the dummy hardmask layer 120 having the greater height. In some embodiments, the dummy hardmask layer 120 comprises silicon oxide, and is conformally deposited by an ALD process. The deposited dummy hardmask thickness is set to be the same or substantially the same as the spacing between adjacent hardmasks. The points (P) are formed at the same distance d (or substantially the same distance d (+5 nm) from the outer hardmask portions 103' as the distance d between adjacent hardmask portions 103'. In some embodiments, the spacing between the adjacent hardmask is about 20 nm and the deposited dummy hardmask layer 120 is 20 nm thick. Due to the deposition occurring on all exposed surfaces, where there are multiple surfaces in relatively close proximity (e.g., between adjacent hardmask portions 103' or between the substrate and the hardmask portions 103'), vacant portions on the substrate are filled in more quickly to create areas having a greater height.

Also shown in FIG. 5, a spacer layer 130 comprising, for example, amorphous silicon, amorphous carbon, polycrystalline silicon, polycrystalline silicon germanium, amorphous silicon germanium, polycrystalline germanium, amorphous germanium and/or silicon carbon oxide (SiCO), is deposited on the dummy hardmask layer 120. The spacer layer 130 can be deposited using deposition techniques, such as, for example, CVD, PECVD, RFCVD, PVD, ALD, MLD, MBD, PLD, LSMCD, and/or sputtering. In accordance with an embodiment of the present invention, the spacer layer 130 is conformally deposited by a CVD process and has a thickness t which is the same or substantially the same (+5 nm) as a lateral width w of the hardmask portions 103'. Alternatively, the spacer layer 130 has a thickness t which is less or greater than a lateral width w of the hardmask portions 103'.

Figure 6:
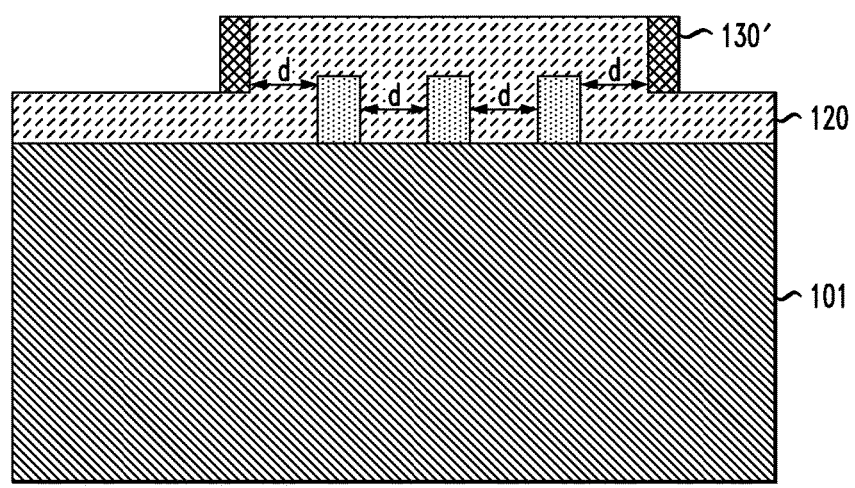
FIG. 6 is a cross-sectional view illustrating spacer formation in a method of manufacturing a semiconductor device, according to an exemplary embodiment of the present invention.

FIG. 6 is a cross-sectional view illustrating spacer formation in a method of manufacturing a semiconductor device, according to an exemplary embodiment of the present invention. Referring to FIG. 6, an anisotropic etching process (e.g., reactive ion etch (RIE)) is performed to directionally remove the horizontal portions of the spacer layer 130 to from spacers 130'. The etching can be performed using, for example, silicon RIE process to remove the horizontal portions of the spacer layer 130.

Figure 7:
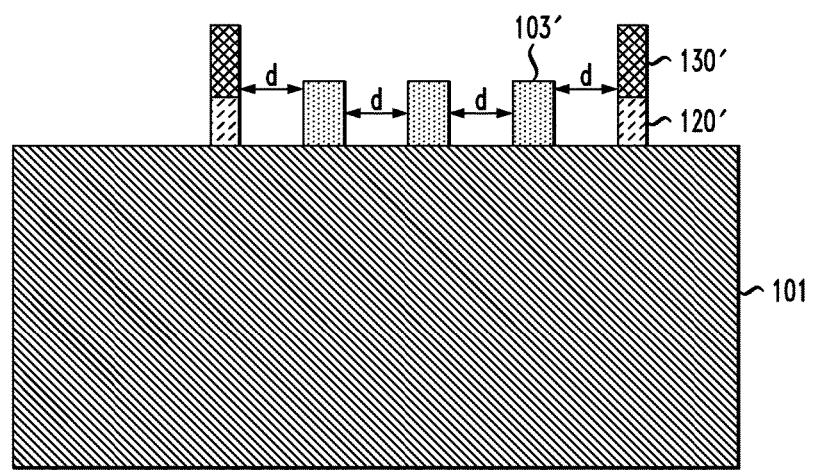
FIG. 7 is a cross-sectional view illustrating removal of exposed portions of the dummy hardmask layer to form dummy hardmask portions in a method of manufacturing a semiconductor device, according to an exemplary embodiment of the present invention.

FIG. 7 is a cross-sectional view illustrating removal of exposed portions of the dummy hardmask layer to form dummy hardmask portions in a method of manufacturing a semiconductor device, according to an exemplary embodiment of the present invention. Referring to FIG. 7, exposed portions of the dummy hardmask layer 120 not covered by the spacers 130' are removed down to the substrate 101 to form dummy hardmask portions 120'. In accordance with an embodiment of the present invention an oxide RIE is performed to remove the portions of the dummy hardmask layer that are not masked by the spacers 130. In some embodiments, the dummy hardmask 120 not covered by the spacers 130' are removed down to the substrate 101 by an RIE process which is selective to the spacers 130' and hardmask portions 103'.

The spacers 130 and underlying dummy hardmask portions 120' are at the same distance d or substantially the same distance d from the outermost hardmask portions 103' as the distance d between adjacent hardmask portions 103'. In addition, in accordance with embodiments of the present invention, the spacers 130 and underlying dummy hardmask portions 120' have a thickness which is the same or substantially the same as a lateral width w of the hardmask portions 103', or less than or greater than a lateral width w of the hardmask portions 103'.

Figure 8:
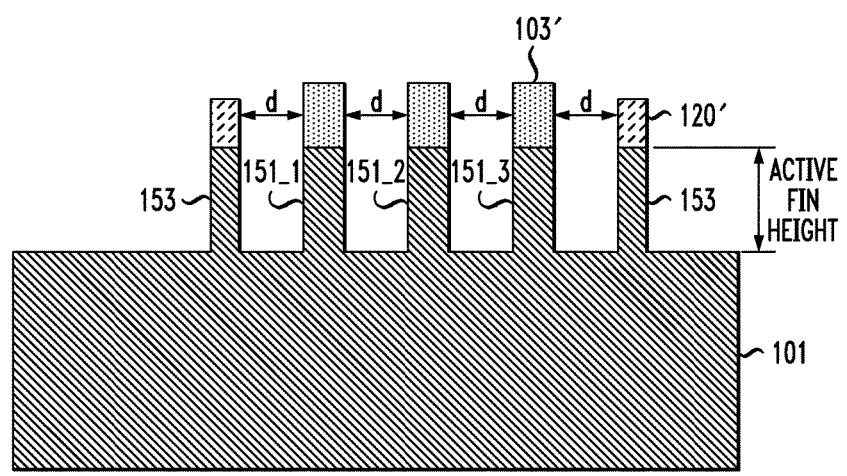
FIG. 8 is a cross-sectional view illustrating removal of the spacers and removal of exposed portions of the substrate not covered by the remaining portions of the hardmask pattern and the dummy hardmask portions to form fins in a method of manufacturing a semiconductor device, according to an exemplary embodiment of the present invention.

FIG. 8 is a cross-sectional view illustrating removal of the spacers and removal of exposed portions of the substrate not covered by the remaining portions of the hardmask pattern and the dummy hardmask portions to form fins in a method of manufacturing a semiconductor device, according to an exemplary embodiment of the present invention. Referring to FIG. 8, using the hardmask portions 103' and the dummy hardmask portions 120' as masks, exposed portions of the substrate 101 not covered by the hardmask portions 103' and the dummy hardmask portions 120' are removed using a substrate etch to form fins 151_1, 151_2 and 151_3 and dummy fins 153. The exposed portions of the substrate 101 are removed to a depth including the active fin height, which includes the active area of the resulting fins. The active fin height can vary depending on design. The substrate etch transfers the pattern of the hardmask and dummy hardmask portions 103', 120' to the substrate to form fins 151_1, 151_2 and 151_3 and dummy fins 153. In accordance with an embodiment of the present invention, substrate 101 including a semiconductor material, such as, Si, SiGe, SiC, Si:C, SiGeC, SiGe:C, III-V, II-V compound semiconductor or other like semiconductor can be selectively etched with respect to the hardmask and dummy hardmask portions 103', 120' using, for example, a silicon RIE process. The silicon RIE further removes the spacers 130' from on top of the dummy hardmask portions 120'.

The use of the dummy hardmask portions 120' adjacent the outermost hardmask portions 103' prevents micro-loading etching effects. The dummy hardmask portions 120' are spaced from the outermost hardmask portions 103' at the same or substantially the same spacing as the distance between adjacent hardmask portion 103' (e.g., distance d). As a result, the fins 151_1 and 151_3 formed at the ends of a pattern of fins formed in a substrate will have the same critical dimension (e.g., lateral width) as inner fins (e.g., fin 151_2) of the pattern. The presence of the dummy hardmask portions 120' and resulting dummy fins 153 creates an environment for the end fins 151_1 and 151_3 which is the same as that of the inner fin (e.g., fin 1512), and prevents micro-loading effects. The micro-loading effects, which cause different critical dimensions for end fins, are due to different environments on the outer sides of the end fins. For example, isolation regions adjacent the outer sides of the end fins can create a different environment that would affect the substrate etch during the fin formation process, and change the critical dimension of the resulting fins adjacent the different environment. Embodiments of the present invention prevent this result by positioning the dummy hardmask adjacent the outermost hardmask portion of a hardmask pattern so as to allow for formation of a dummy fin which blocks the effects of an adjacent isolation region or other element causing a different environment for an outer fin. As can be seen in FIG. 8, the fins 151_1, 151_2 and 151_3 each have the same or substantially the same (±2 nm) critical dimension (e.g., lateral width) in the active fin area, so that the fins 151_1, 151_2 and 151_3 in the fin pattern have symmetric profiles.

FIG. 9 is a cross-sectional view illustrating removal of the dummy hardmask portions in a method of manufacturing a semiconductor device, according to an exemplary embodiment of the present invention. Referring to FIG. 9, the dummy hardmask portions 120', which have a different material (e.g., oxide) from the hardmask portions 103' (e.g., nitride) are selectively removed from the dummy fins 153. The selective removal can be performed using an etch which selectively removes a material of the dummy hardmask portions 120' with respect to a material of the hardmask portions 103', such as, for example dry etch, such as chemical oxide removal, or wet etch containing hydrogen fluoride acid. The "active fin height" in FIG. 9 can have, but is not necessarily limited to, a vertical height ranging from 30 nm to 60 nm.

FIG. 10 is a cross-sectional view illustrating further removal of exposed portions of the substrate not covered by the remaining portions of the hardmask pattern in a method of manufacturing a semiconductor device, according to an exemplary embodiment of the present invention. Referring to FIG. 10, after removal of the dummy hardmask portions 120' from the dummy fins 153, using the hardmask portions 103' as masks, exposed portions of the substrate 101 not covered by the hardmask portions 103' are removed using a substrate etch to form fins 151_1', 1512' and 151_3' extending to a depth below the active fin height. This etch forms an area for isolation regions (e.g., shallow trench isolation (STI) regions) under the active fin area, which is subsequently filled by a dielectric. Referring to FIG. 10, since the dummy hardmask portions 120' have been removed, the substrate etch recesses the dummy fins to a lower height below the active fin area, so that the resulting dummy fins 153' are confined to an inactive region and are not in the active fin array. The lateral width of the dummy fins is also reduced by the etching. Alternatively, the dummy fins may be completely removed.

Since the active fin area has already been etched with the presence of the dummy fins creating the same environment for end fins as that of the inner fins, the dummy fins are no longer needed for the further etching to create the isolation regions. As can be seen in FIG. 10, due to the reduction in size of the dummy fins, the micro-loading effect occurs on the end fins 151_1' and 151_3', resulting in a different critical dimension at the bottom portions of the fins 151_1' and 151_3' when compared to the critical dimension at the bottom portion of the inner fin 151_2'. Arrows A1 and A2, respectively point to wider portions at the bottom of fins 151_1' and 151_3' when compared with the bottom portion of fin 151_2'. However, this asymmetry between end fins 151_1' and 151_3' is limited to the isolation region, which is out of the active fin region, and consequently, does not affect operation of a resulting device. In other words, the symmetrical profiles of the fins are maintained in the active area. A non-limiting range of the total fin height is 80 nm-150 nm.

FIG. 11 is a cross-sectional view illustrating isolation layer deposition to form isolation regions and hardmask removal in a method of manufacturing a semiconductor device, according to an exemplary embodiment of the present invention. Referring to FIG. 11, an isolation layer 160 including, for example, a dielectric material, including, but not necessarily limited to silicon oxide, silicon nitride, silicon oxynitride, or some other dielectric, or any suitable combination of those materials, is deposited on exposed areas of the substrate 101, which can be patterned to form isolation regions, such as, for example, STI regions. The isolation layer 160 is positioned on the substrate 101 on sides of the fins 151_1', 151_2' and 151_3'. The isolation layer 160 can be deposited using deposition techniques including, but not limited to, CVD, PECVD, RFCVD, PVD, ALD, MBD, PLD, LSMCD, sputtering, spin-on coating, and/or plating, followed by a planarization process, such as, CMP to remove excess isolation material. The isolation layer 160 is maintained at a height below the active fin area. As can be seen, the remaining dummy fins 153' and the tapered/wider portions of the fins 151_1' and 151_3' are also below the active fin area and covered by the isolation layer 160. In some embodiments, the isolation layer 160 comprises a silicon nitride liner on fin sidewalls and silicon oxide between fins.

Referring to FIG. 11, the hardmask portions 103' are removed from the fins 151_1', 151_2', and 151_3'. The hardmask portions, which comprise, for example, SiN, can be removed using, for example, a wet etch solution containing phosphoric acid. Alternatively, the SiN hardmask can be removed by chemical dry etch.

FIGS. 12A and 12B are cross-sectional views and FIG. 12C is a top view illustrating formation of a gate structure, spacers and source/drain regions in a method of manufacturing a semiconductor device, according to an exemplary embodiment of the present invention. The cross-sectional views in FIGS. 12A and 12B are taken along the lines A-A and B-B in FIG. 12C, respectively. Referring to FIGS. 12A-12C, a FinFET transistor including the fin structure according to an embodiment of the present invention, is shown. The FinFET structure includes a gate structure including a gate dielectric 172, gate conductor 170, gate spacer 174 and source/drain regions 181, 182. The device shown in FIGS. 12A-12C can be subject to further processing to form other device structures (not shown), such as contacts and back-end-of-line (BEOL) wirings.

The gate dielectric 172 is formed on exposed sidewalls of the fins 151_1', 151_2' and 151_3', and over portions of the dielectric layer 160 (e.g. isolation layer). The gate dielectric 172 may be formed of silicon oxide, silicon nitride, silicon oxynitride, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum, aluminum, magnesium. The gate dielectric 172 may be formed using ALD or CVD processing, although other suitable processes may be used. The gate dielectric 172 has a uniform thickness in the non-limiting range of 1 nm to 3 nm.

The gate conductor 170 is formed over the gate dielectric 172 in the active fin region. The gate conductor 170 may be formed of any suitable conducting material, including but not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. In some embodiments, the gate conductor 170 includes a work function metal layer to set the threshold voltage of the transistor to a desired value. The work function layer may be a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), titanium aluminum carbide (TiAlC), tantalum carbide (TaC), hafnium carbide (HfC), and combinations thereof. The gate structure can be formed by any suitable gate formation processing such as so-called "gate-first", "gate-last", or "replacement metal gate" processing.

The gate spacers 174 surround the gate conductor 170 and gate dielectric 172 over each of the fins 151_1', 151_2' and 151_3' as illustrated in the figures. The gate spacers 174 may be formed of silicon oxide (SiO), a nitride, such as SiN, or an oxynitride such as silicon oxynitride (SiON), SiOC, SiBCN, SiCN, or combinations thereof, although other suitable materials may be used. The gate spacers 174 may be formed using deposition (e.g., CVD, ALD, PECVD, etc.) followed by RIE processing. The gate spacers 174 may have a uniform thickness surrounding the gate conductor 170 and gate dielectric 172, in the non-limiting range of 3 nm to 10 nm. Source/drain regions 181, 182 can be formed by epitaxy processing. Dopants can be incorporated in the source/drain regions 181, 182, for example, during source/drain epitaxy processing. Such a doping technique is so-called in-situ doping. Other doping techniques include but are not limited to, ion implantation, gas phase doping, plasma doping, plasma immersion ion implantation, cluster doping, infusion doping, liquid phase doping, solid phase doping, etc.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
    forming a hardmask layer on a substrate;
    patterning the hardmask layer to form a plurality of patterned hardmask portions on the substrate;
    depositing a dummy hardmask layer on the substrate;
    patterning the dummy hardmask layer to form a plurality of patterned dummy hardmask portions on the substrate, wherein each of the plurality of patterned dummy hardmask portions is positioned adjacent respective outermost patterned hardmask portions of the plurality of patterned hardmask portions;
    transferring a pattern of the plurality of patterned hardmask portions and the plurality of patterned dummy hardmask portions to the substrate to form a plurality of fins and a plurality of dummy fins from the substrate; and
    forming a spacer layer on the dummy hardmask layer.

2. The method according to claim 1, wherein a distance between a patterned dummy hardmask portion and an adjacent outermost patterned hardmask portion is the same or substantially the same as a distance between two adjacent patterned hardmask portions.

3. The method according to claim 1, wherein a width of a patterned dummy hardmask portion is the same or substantially the same as a width of a patterned hardmask portion.

4. The method according to claim 1, further comprising removing portions of the spacer layer to form a plurality of spacers on the dummy hardmask layer.

5. The method according to claim 4, wherein a width of a spacer of the plurality of spacers is the same or substantially the same as a width of a patterned hardmask portion.

6. The method according to claim 4, wherein the plurality of spacers cover portions of the dummy hardmask layer, and wherein the patterning of the dummy hardmask layer comprises removing remaining portions of the dummy hardmask layer not covered by the plurality of spacers.

7. The method according to claim 6, further comprising removing the plurality of spacers from the plurality of patterned dummy hardmask portions.

8. The method according to claim 1, wherein the plurality of patterned hardmask portions and patterned dummy hardmask portions cover portions of the substrate and the transferring comprises etching remaining portions of the substrate not covered by the plurality of patterned hardmask portions and patterned dummy hardmask portions to form the plurality of fins and dummy fins.

9. The method according to claim 8, wherein the etching is performed to a depth including an active height of the plurality of fins.

10. The method according to claim 9, further comprising removing the plurality of patterned dummy hardmask portions from the plurality of dummy fins.

11. The method according to claim 10, further comprising further etching remaining portions of the substrate not covered by the plurality of patterned hardmask portions, including the plurality of dummy fins to a depth below the active height of the plurality of fins.

12. The method according to claim 11, further comprising forming a dielectric layer on the substrate to a height below the active height of the plurality of fins.

13. The method according to claim 8, wherein a width of each of the plurality of fins is the same or substantially the same.

* * * * *